(12) United States Patent
Park et al.

(10) Patent No.: US 7,994,065 B2
(45) Date of Patent: Aug. 9, 2011

(54) METHOD FOR FABRICATING SEMICONDUCTOR DEVICE

(75) Inventors: Sang-Soo Park, Kyoungki-do (KR); Su-Bum Shin, Kyoungki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 807 days.

(21) Appl. No.: 11/951,195

(22) Filed: Dec. 5, 2007

(65) Prior Publication Data

US 2009/0061639 A1    Mar. 5, 2009

(30) Foreign Application Priority Data

Aug. 31, 2007 (KR) ........................ 10-2007-0088443

(51) Int. Cl.
*H01L 21/302* (2006.01)
*H01L 21/461* (2006.01)

(52) U.S. Cl. ........ 438/706; 438/707; 438/708; 438/709; 438/710; 438/725

(58) Field of Classification Search ........................ None
See application file for complete search history.

(56) References Cited

U.S. PATENT DOCUMENTS

| 5,935,735 | A | 8/1999 | Okubo et al. | |
|---|---|---|---|---|
| 6,042,650 | A | 3/2000 | Uesugi et al. | |
| 2004/0137748 | A1* | 7/2004 | Jain et al. | 438/710 |
| 2008/0153299 | A1* | 6/2008 | Kim | 438/703 |
| 2008/0268641 | A1* | 10/2008 | Lee et al. | 438/674 |

FOREIGN PATENT DOCUMENTS

| KR | 100618907 B1 | 8/2006 |
|---|---|---|
| KR | 100752674 B1 | 8/2007 |
| KR | 1020070093177 A | 9/2007 |

* cited by examiner

*Primary Examiner* — Duy-Vu N Deo
(74) *Attorney, Agent, or Firm* — Kilpatrick Townsend & Stockton LLP

(57) ABSTRACT

A method for fabricating a semiconductor device includes stacking a spin on carbon (SOC) layer and an multifunction hard mask (MFHM) layer on a substrate, forming a photoresist pattern over the MFHM layer, first etching the MFHM layer using a first amount of a fluorine-based gas, second etching the MFHM layer using a second amount of a fluorine-based gas, wherein the second amount is less than the first amount, etching the SOC layer using the MFHM layer as an etch barrier, and etching the substrate using the SOC layer and the MFHM layer as an etch barrier.

7 Claims, 8 Drawing Sheets

METHOD FOR FABRICATING SEMICONDUCTOR DEVICE

CROSS-REFERENCES TO RELATED APPLICATIONS

The present invention claims priority of Korean patent application number 2007-0088443, filed on Aug. 31, 2007, which is incorporated by reference in their entirety.

BACKGROUND OF THE INVENTION

The present invention relates to a method for fabricating a semiconductor device, and more particularly, to a method for fabricating a semiconductor device using a multifunction hard mask (MFHM) layer.

As semiconductor devices become highly integrated, a micro sized pattern is fabricated and a photoresist layer becomes thinner in a mask process. As the photoresist layer becomes thinner, an etching margin is insufficient during an etching process and material formed at a lower portion of the photoresist layer is only partially etched, resulting in a reduction of a process margin. Such a reduction of the process margin may deteriorate characteristics of a semiconductor device. Currently, since the photoresist layer cannot ensure a sufficient process margin, the use of amorphous carbon as a hard mask has been suggested.

However, amorphous carbon may increase fabricating costs and make it difficult to perform the etching process. Further, in order to use the amorphous carbon as a hard mask, a silicon oxy-nitride (SiON) layer and an anti-reflective coating layer must be additionally formed before forming a photoresist layer.

An MFHM layer has been developed and employed as a substitute for amorphous carbon layer. The MFHM layer can be prepared in the form of a stack structure including a spin on carbon (SOC) layer and an MFHM layer. Since both the SOC layer and the MFHM layer can be formed through a coating process, the MFHM layer is advantageous in terms of the process margin and fabricating costs compared with the amorphous carbon.

However, when an over-etch is performed in an etch process in which the MFHM layer is etched using a fluorine-based gas, the SOC layer may be deformed by the fluorine-based gas.

FIGS. 1A and 1B are perspective views illustrating deformation of an SOC layer 11 due to a fluorine group.

If the fluorine group contacts the SOC layer 11 as shown in FIG. 1A, the SOC layer 11 may be deformed (11A) due to a stress in the layer (volume expansion) as shown in FIG. 1B.

FIG. 2 is a view illustrating a bond structure of an SOC layer and a fluorine group.

Referring to FIG. 2, as the fluorine group F consisting of large particles penetrates into the SOC layer in which hydrogen H consisting of small particles is bonded to carbon C consisting of large particles, the hydrogen H is replaced with the fluorine group F and then the fluorine group F reacts with the carbon C, so that the volume of the SOC layer increases.

SUMMARY OF THE INVENTION

Embodiments of the present invention are directed to providing a method for fabricating a semiconductor device, in which the volume of an SOC layer can be prevented from being expanded during an etch process by using an MFHM layer for reduction of fabricating costs.

In accordance with an aspect of the present invention, there is provided a method for fabricating a semiconductor device. The method includes stacking a spin on carbon (SOC) layer and an multifunction hard mask (MFHM) layer on a substrate, forming a photoresist pattern over the MFHM layer, first etching the MFHM layer using a first amount of a fluorine-based gas, second etching the MFHM layer using a second amount of a fluorine-based gas, wherein the second amount is less than the first amount, etching the SOC layer using the MFHM layer as an etch barrier, and etching the substrate using the SOC layer and the MFHM layer as an etch barrier.

In accordance with another aspect of the present invention, there is provided a method for fabricating a semiconductor device. The method includes forming an interlayer dielectric layer over a substrate, stacking an SOC layer and an MFHM layer on the interlayer dielectric layer, forming a photoresist pattern over the MFHM layer, first etching the MFHM layer using a first amount of a fluorine-based gas, second etching the MFHM layer using a second amount of a fluorine-based gas, wherein the second amount is smaller than the first amount, etching the SOC layer using the MFHM layer as an etch barrier, and etching the interlayer dielectric layer using the SOC layer and the MFHM layer as an etch barrier to form a contact hole

DESCRIPTION OF SPECIFIC EMBODIMENTS

Embodiments of the present invention relate to a method for fabricating a semiconductor device.

According to the present invention, when using an MFHM layer to reduce fabricating costs, an amount of a fluorine-based gas, which is a factor of volume expansion, is reduced and a helium (He) gas having a sputtering effect is employed during an over-etch process for the MFHM layer.

FIGS. 3A to 3E are cross-sectional views of a procedure for fabricating a semiconductor device according to one embodiment of the present invention.

Figure 1A:
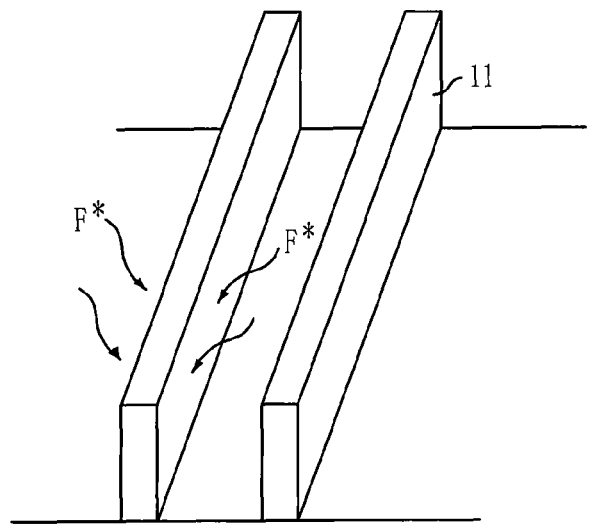
FIGS. 1A and 1B are perspective views illustrating deformation of an SOC layer due to a fluorine group.
Figure 1B:
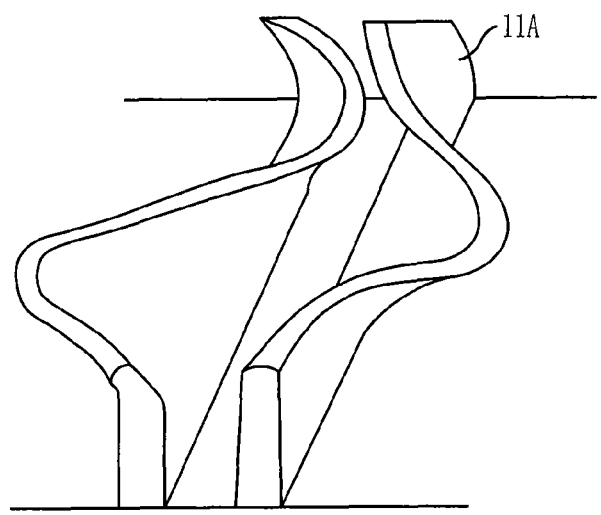
Figure 2:
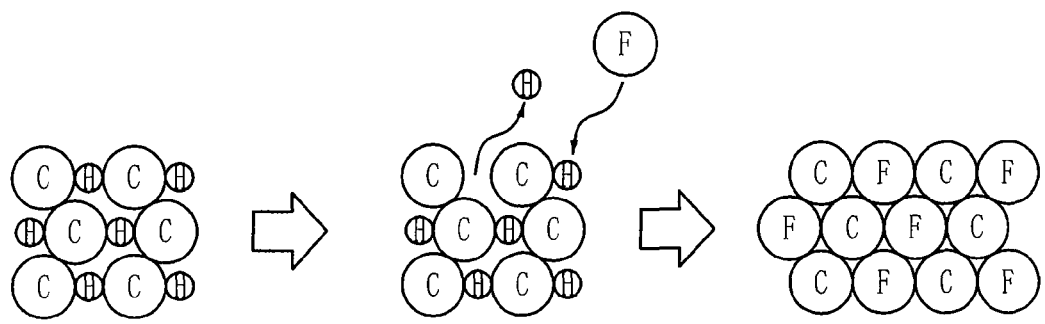
FIG. 2 is a view illustrating a bond structure of an SOC layer and a fluorine group.
Figure 3A:
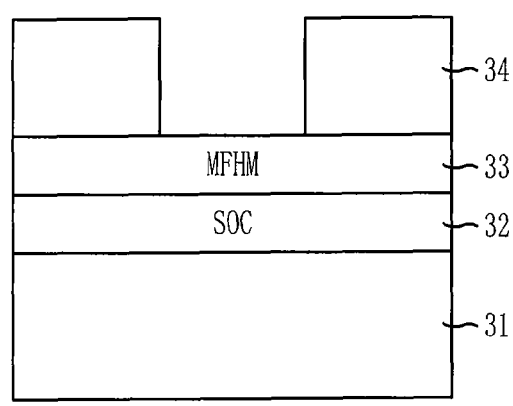
FIGS. 3A to 3E are cross-sectional views of a procedure for fabricating a semiconductor device according to one embodiment of the present invention.

Referring to FIG. 3A, an SOC layer 32 and an MFHM layer 33 are stacked on a substrate 31. The substrate 31 may include a semiconductor substrate for which a DRAM process is performed. The MFHM layer 33 can be formed such that silicon in the MFHM layer 33 has a content (mass ratio) of approximately 33% to approximately 40%. Further, the MFHM layer 33 and the SOC layer 32 can be formed by coating polymer solution including carbon using a coating apparatus.

As described above, the SOC layer 32 and the MFHM layer 33 are stacked on the substrate 31, so that fabricating costs and a process margin can be reduced while obtaining the same effect as that acquired when using amorphous carbon as a hard mask. That is, since the SOC layer 32 functions as the amorphous carbon which is the hard mask used for etching the substrate 31, and the MFHM layer 33 functions as both a SiON layer, which acts as the hard mask used for etching the amorphous carbon, and an anti-reflective layer, the process margin can be reduced compared with a case of individually forming the SiON layer and the anti-reflective layer. Further, since both the SOC layer 32 and the MFHM layer 33 are formed through an inexpensive coating scheme, an expensive deposition method such as chemical vapor deposition is not necessary, so that fabricating costs can be reduced. As a result, production costs can be reduced by about ⅕ compared with a case of using the amorphous carbon as the hard mask.

A photoresist pattern 34 is formed over the MFHM layer 33. The photoresist pattern 34 can be formed by coating a photoresist layer on the MFHM layer 33, and then patterning the photoresist layer through a photo-exposure process and a development process such that an etch region is exposed. The photo-exposure process refers to a process of exposing the photoresist layer to ultraviolet light such that the phase of a mask is transferred to a wafer (substrate 31) after alignment. The development process refers to a process of removing the photoresist layer from regions which are not defined through the masking and the photo-exposure process.

Figure 3B:
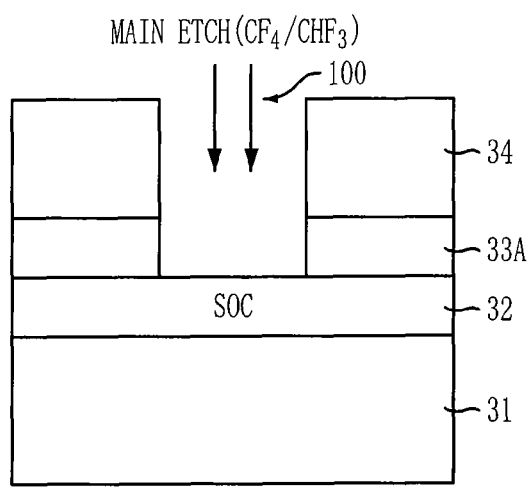
Figure 3C:
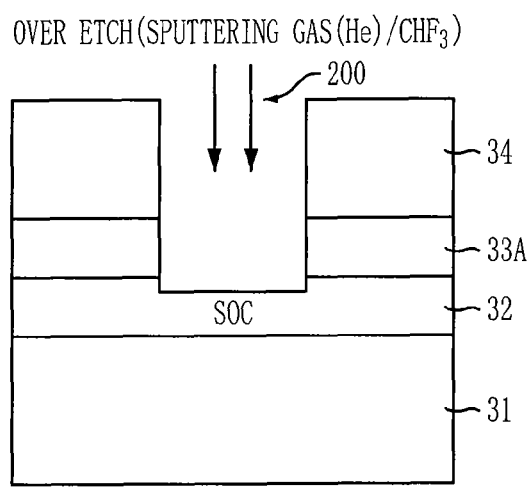

The MFHM layer 33 is etched using the photoresist pattern 34. In order to prevent volume expansion of the SOC layer 32, main-etch 100 and over-etch 200 can be separately performed when etching the MFHM layer 33. FIG. 3B is a cross-sectional view illustrating the main-etch 100 of the MFHM layer 33 and FIG. 3C is a cross-sectional view illustrating the over-etch 200 of the MFHM layer 33.

Referring to FIG. 3B, the main-etch 100 is performed relative to the MFHM layer 33. The main-etch 100 may be performed using a fluorine-based gas. The fluorine-based gas may be a gas mixture of tetrafluoromethane ($CF_4$) and fluoroform ($CHF_3$).

An example recipe for the main-etch 100 of the MFHM layer 33 using the fluorine-based gas includes a pressure of approximately 70 mTorr, a top power of approximately 1,000 W, a bottom power of approximately 400 W, approximately 120 sccm of $CF_4$, approximately 100 sccm of $CHF_3$, approximately 5 sccm of $O_2$, and a process time of approximately 40 seconds.

In particular, the main-etch 100 of the MFHM layer 33 can be performed until the SOC layer 32 is exposed. This is for preventing the volume of the SOC layer 32 from expansion due to the reaction of the fluorine-based gas with the MFHM layer 33 and the SOC layer 32.

Referring to FIG. 3C, the over-etch 200 is performed relative to the MFHM layer 33. The over-etch 200 can be performed using a sputtering gas having a sputtering effect and a fluorine-based gas capable of etching a silicon component. In particular, the amount of the fluorine-based gas used for the over-etch 200 is smaller than the amount of fluorine-based gas used for the main-etch 100.

The fluorine-based gas used for the over-etch 200 includes $CHF_3$ and the sputtering gas used for the over-etch 200 includes helium (He) gas. In detail, $CHF_3$ of approximately 8 sccm to approximately 12 sccm and He gas of approximately 90 sccm to approximately 110 sccm are used. The reason for using He gas as the sputtering gas is because the particles of He gas are smaller than those of Ar gas and thus the volume expansion of the SOC layer 32 can be suppressed. That is, the sputtering gas can penetrate into lattices of the SOC layer 32 by physical force because the sputtering gas is not subject to a chemical reaction. However, even if the He gas penetrates into lattices of the SOC layer 32, the He gas does not influence the volume expansion of the SOC layer 32 because the particles of the He gas are relatively small.

An example recipe for the over-etch 200 includes a pressure of approximately 70 mTorr, a top power of approximately 1,000 W, a bottom power of approximately 400 W, approximately 10 sccm of $CF_3$, approximately 100 sccm of He gas, approximately 50 sccm of $O_2$, and a process time of approximately 40 seconds.

As described above, the over-etch 200 is performed after the sputtering gas is added to a small amount of the fluorine-based gas so that the volume of the SOC layer 32 does not expand due to the fluorine-based gas. That is, the amount of the fluorine-based gas is reduced such that most of the fluorine-based gas is subject to the reaction, and then the sputtering gas is added to the fluorine-based gas to facilitate the etch process for the silicon component in the MFHM layer 33.

Accordingly, the MFHM layer 33 is etched without volume expansion of the SOC layer 32 to form an MFHM pattern 33A.

Figure 3D:
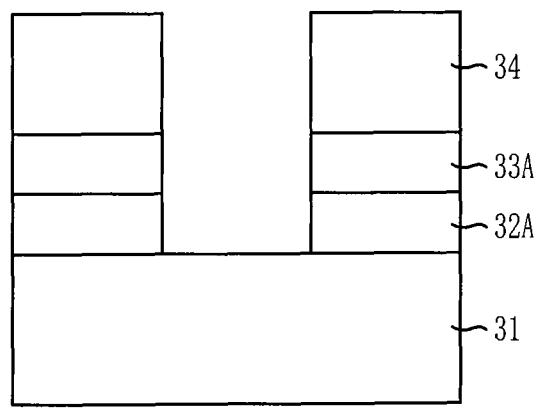

Referring to FIG. 3D, the SOC layer 32 is etched using the MFHM pattern 33A as an etch barrier to form an SOC pattern 32A.

An example etch recipe for the SOC layer 32 includes a pressure of approximately 20 mTorr, a top power of approximately 2,000 W, a bottom power of approximately 1,000 W, approximately 300 sccm of Ar gas, approximately 75 sccm of $O_2$, approximately 100 sccm of CO, and a process time of approximately 30 seconds.

Figure 3E:
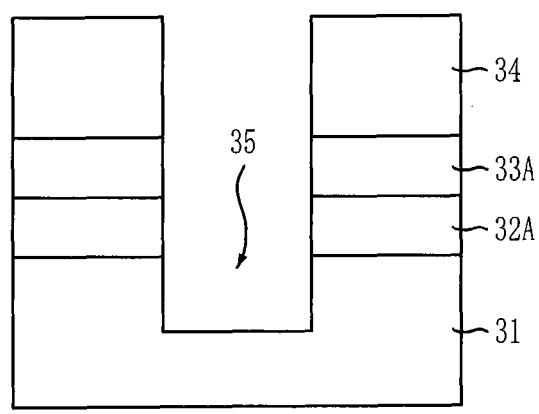

Referring to FIG. 3E, the substrate 32 is etched using the MFHM pattern 33A and the SOC pattern 32A as etch barriers to form a trench 35.

FIGS. 4A to 4E are cross-sectional views of a procedure for forming a storage node contact hole in a semiconductor device according to one embodiment of the present invention.

Figure 4A:
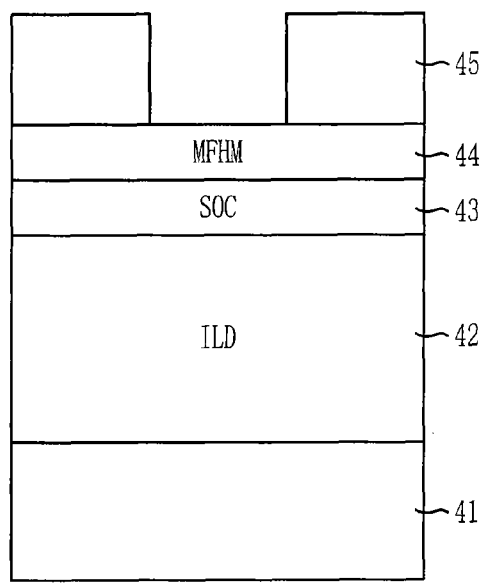
FIGS. 4A to 4E are cross-sectional views of a procedure for forming a storage node contact hole in a semiconductor device according to one embodiment of the present invention.

Referring to FIG. 4A, an interlayer dielectric layer 42 is formed over a substrate 41. The substrate 41 may include a semiconductor substrate for which a DRAM process is performed. The interlayer dielectric layer 42 may include an oxide layer. A process for forming a gate pattern and a bit line pattern may be performed before forming the interlayer dielectric layer 42.

An SOC layer 43 and an MFHM layer 44 are stacked on the interlayer dielectric layer 42. The MFHM layer 44 can be formed such that silicon in the MFHM layer 44 has a content (mass ratio) of approximately 33% to approximately 40%. Further, the MFHM layer 44 and the SOC layer 43 can be formed by coating polymer solution including carbon using a coating apparatus.

As described above, the SOC layer 43 and the MFHM layer 44 are stacked on the substrate 41, so that fabricating costs and a process margin can be reduced while obtaining the same effect as that acquired when using amorphous carbon as a hard mask. That is, since the SOC layer 43 functions as the amorphous carbon which is the hard mask used for etching the substrate 41, and the MFHM layer 44 functions as both a SiON layer, which acts as the hard mask used for etching the amorphous carbon, and an anti-reflective layer, the process margin can be reduced compared with a case of individually forming the SiON layer and the anti-reflective layer. Further, since both the SOC layer 43 and the MFHM layer 44 are formed through an inexpensive coating process, an expensive deposition method such as chemical vapor deposition is not necessary, so that fabricating costs can be reduced. As a result, the production cost can be reduced by about ⅕ compared with a case of using the amorphous carbon as a hard mask.

A photoresist pattern 45 is formed over the MFHM layer 44. The photoresist pattern 45 can be formed by coating a photoresist layer on the MFHM layer 44, and patterning the photoresist layer through a photo-exposure process and a development process such that an etch region is exposed. The photo-exposure process refers to a process of exposing the photoresist layer to ultraviolet light such that the phase of a mask is transferred to a wafer (substrate 41) after alignment. The development process refers to a process of removing the photoresist layer from regions which are not defined through the masking and the photo-exposure process.

Figure 4B:
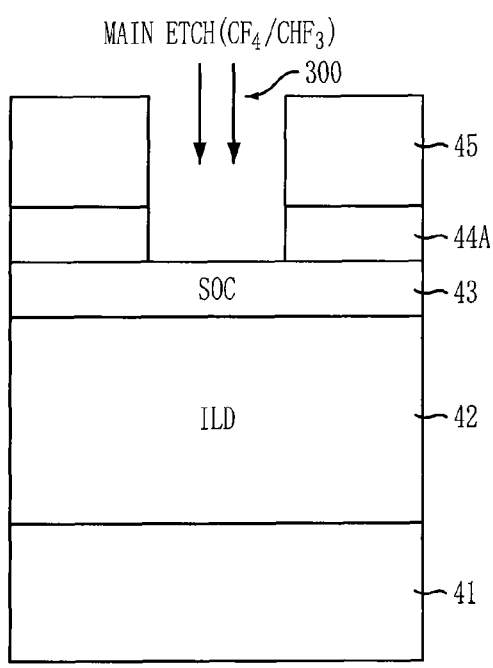
Figure 4C:
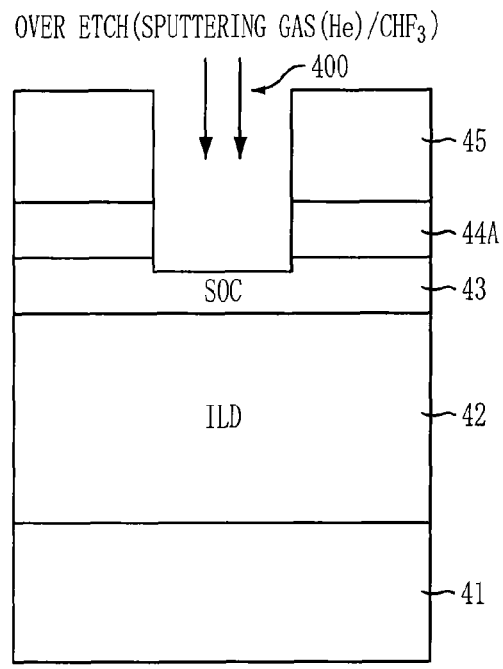

The MFHM layer 44 is etched using the photoresist pattern 45. In order to prevent volume expansion of the SOC layer 43, main-etch 300 and over-etch 400 can be separately performed when etching the MFHM layer 44. FIG. 4B is a cross-sectional view illustrating the main-etch 300 of the MFHM layer 44 and FIG. 4C is a cross-sectional view illustrating the over-etch 400 of the MFHM layer 44.

Referring to FIG. 4B, the main-etch 300 is performed relative to the MFHM layer 44. The main-etch 300 may be performed using a fluorine-based gas. The fluorine-based gas may be a gas mixture of $CF_4$ and $CHF_3$.

An example recipe for the main-etch 300 of the MFHM layer 44 using the fluorine-based gas includes a pressure of 70 mTorr, a top power of approximately 1,000 W, a bottom power of approximately 400 W, approximately 120 sccm of $CF_4$, approximately 100 sccm of $CHF_3$, approximately 5 sccm of $O_2$, and a process time of approximately 40 seconds.

The main-etch 300 of the MFHM layer 44 can be performed until the SOC layer 43 is exposed. This is for preventing the volume of the SOC layer 43 from expansion due to the reaction of the fluorine-based gas with the MFHM layer 44 and the SOC layer 43.

Referring to FIG. 4C, the over-etch 400 is performed relative to the MFHM layer 44. The over-etch 400 can be performed using a sputtering gas having a sputtering effect and a fluorine-based gas capable of etching a silicon component. The amount of the fluorine-based gas used for the over-etch 400 is smaller than the amount of fluorine-based gas used for the main-etch 300.

The fluorine-based gas used for the over-etch 400 includes $CHF_3$ and the sputtering gas used for the over-etch 400 includes He gas. In detail, $CHF_3$ of approximately 8 sccm to approximately 12 sccm and He gas of approximately 90 sccm to approximately 110 sccm are used. The reason for using He gas as the sputtering gas is because the particles of He gas are smaller than those of Ar gas and thus the volume expansion of the SOC layer 43 can be suppressed. That is, the sputtering gas can penetrate into lattices of the SOC layer 43 by physical force because the sputtering gas is not subject to a chemical reaction. However, even if the He gas penetrates into lattices of the SOC layer 43, the He gas does not influence the volume expansion of the SOC layer 43 because the particles of the He gas are relatively small.

An example recipe for the over-etch 400 includes a pressure of approximately 70 mTorr, a top power of approximately 1,000 W, a bottom power of approximately 400 W, approximately 10 sccm of $CHF_3$, approximately 100 sccm of He gas, approximately 50 sccm of $O_2$, and a process time of approximately 40 seconds.

As described above, as the over-etch 400 is performed after the sputtering gas is added to a small amount of the fluorine-based gas, the volume of the SOC layer 43 does not expand due to the fluorine-based gas. That is, the amount of the fluorine-based gas is reduced such that most of the fluorine-based gas is subject to the reaction, and then the sputtering gas is added to the fluorine-based gas to facilitate the etch process for the silicon component in the MFHM layer 44.

Accordingly, the MFHM layer 44 is etched without volume expansion of the SOC layer 43 to form an MFHM pattern 44A.

Figure 4D:
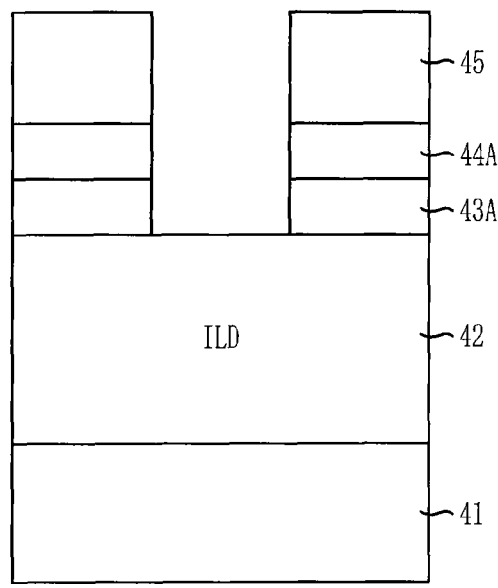

Referring to FIG. 4D, the SOC layer 43 is etched using the MFHM pattern 44A as an etch barrier to form an SOC pattern 43A.

An example etch recipe for the SOC layer 43 includes a pressure of approximately 20 mTorr, a top power of approximately 2,000 W, a bottom power of approximately 1,000 W, approximately 300 sccm of Ar gas, approximately 75 sccm of $O_2$, approximately 100 sccm of CO, and a process time of approximately 30 seconds.

Figure 4E:
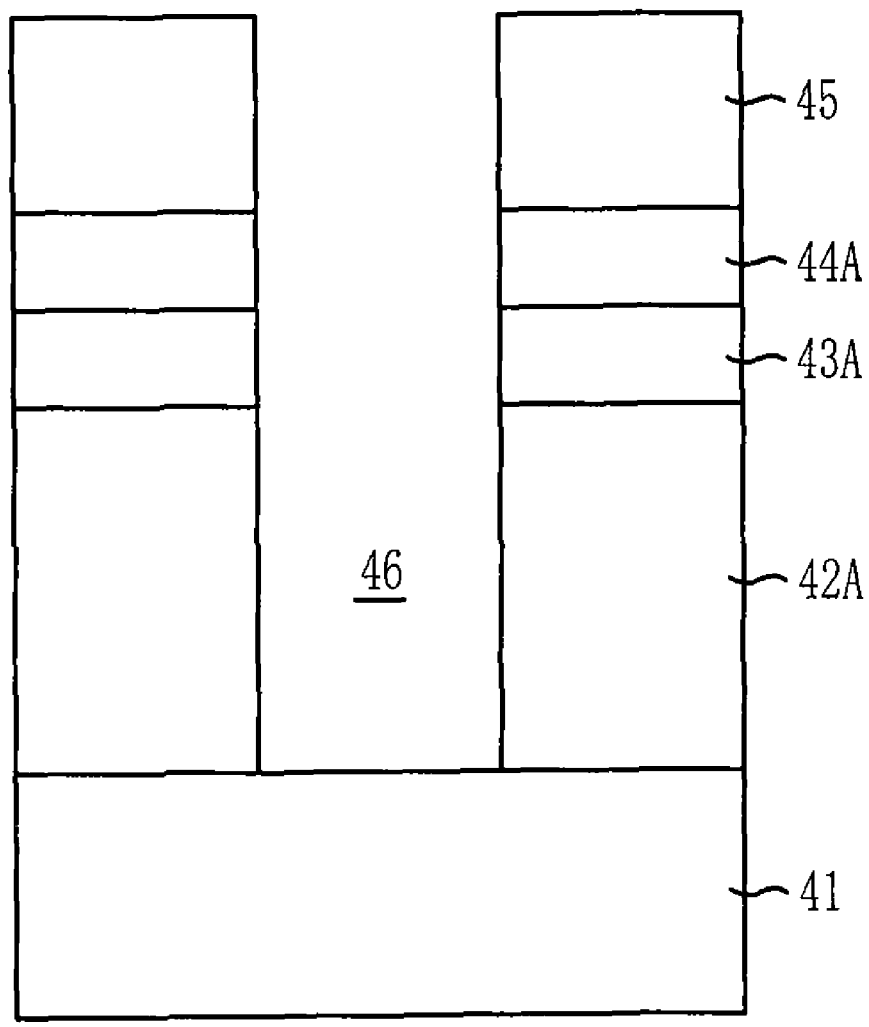

Referring to FIG. 4E, the interlayer dielectric layer 42 is etched using the MFHM pattern 44A and the SOC pattern 43A as etch barriers to form a contact hole 46 that exposes the substrate 41. The etched interlayer dielectric layer 42 becomes an interlayer dielectric pattern 42A that provides the contact hole 46.

The SOC pattern 43A, the MFHM pattern 44A and the photoresist pattern 45 are removed, conductive material is formed to fill the contact hole 46, and then a planarization process is performed until a surface of the interlayer dielectric pattern 42A is exposed, so that a storage node contact plug can be formed.

Figure 5A:
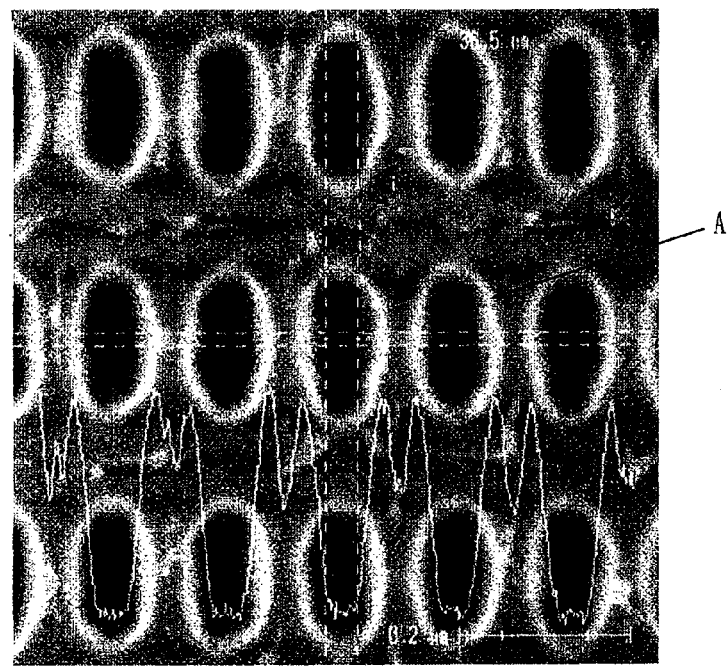
FIGS. 5A and 5B are micrographic views for comparing a typical storage node contact plug with a storage node contact plug in accordance with an embodiment of the present invention.
Figure 5B:
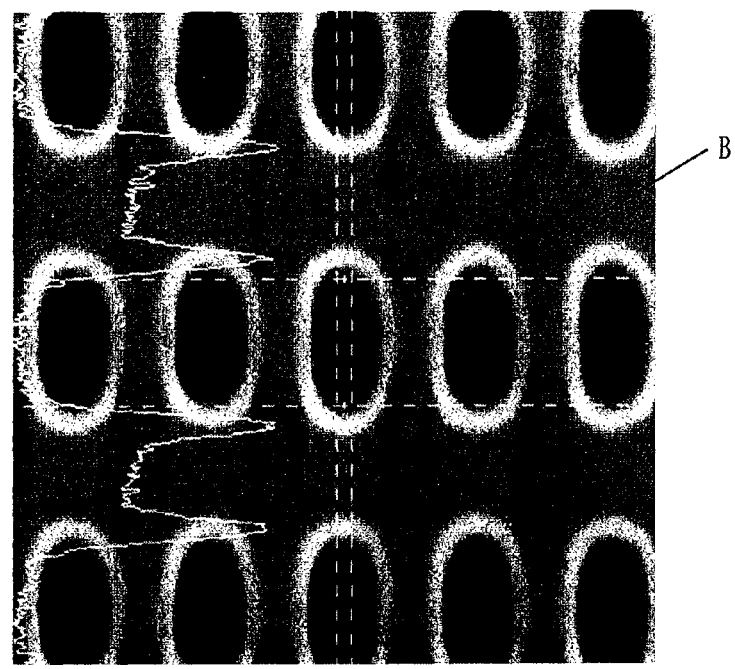

FIGS. 5A and 5B are micrographic views for comparing a typical storage node contact plug with a storage node contact plug according to one embodiment of the present invention.

Referring to FIG. 5A, the typical storage node contact plug has a distorted shape A, rather than a rounded shape, due to the volume expansion of an SOC layer.

Referring to FIG. 5B, the storage node contact plug according to the present invention has a rounded shape B without volume expansion of an SOC layer.

The present embodiment as described above can be applied to various etch processes for forming a pattern, a recess and a contact hole, in addition to a trench and a storage node contact hole, by using an SOC layer and an MFHM.

According to a method for fabricating a semiconductor device as described above, an etch having a sputtering effect is performed during an over-etch of an MFHM layer, so that the volume of an SOC layer does not expand due to a fluorine gas group, thereby reducing fabricating costs and ensuring device reliability.

While the present invention has been described with respect to specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor device, the method comprising:

stacking a spin on carbon (SOC) layer and a multifunction hard mask (MFHM) layer on a substrate, wherein the SOC layer formed beneath the MFHM layer contains carbon;

forming a photoresist pattern over the MFHM layer;

first etching the MFHM layer using a first amount of a fluorine-based gas;

second etching the first-etched MFHM layer using a second amount of a fluorine-based gas, wherein the second amount is less than the first amount;

etching the SOC layer using the second-etched MFHM layer as an etch barrier; and etching the substrate using the etched SOC layer and the second-etched MFHM layer as an etch barrier, wherein the fluorine-based gas used in second etching the first-etched MFHM consists essentially of a gas mixture of $CHF_3$ at a flow of approximately 8 sccm to approximately 12 sccm and He at a flow rate of approximately 90 sccm to approximately 110 sccm.

2. The method of claim 1, wherein the MFHM layer contains silicon.

3. The method of claim 1, wherein the fluorine-based gas used in first etching the MFHM layer includes a gas mixture of $CF_4$ and $CHF_3$.

4. A method for fabricating a semiconductor device, the method comprising:

forming an interlayer dielectric layer over a substrate;

stacking an SOC layer and an MFHM layer on the interlayer dielectric layer, wherein the SOC layer formed beneath the MFHM layer contains carbon;

forming a photoresist pattern over the MFHM layer;

first etching the MFHM layer using a first amount of a fluorine-based gas;

second etching the first-etched MFHM layer using a second amount of a fluorine-based gas, wherein the second amount is less than the first amount;

etching the SOC layer using the second-etched MFHM layer as an etch barrier; and etching the interlayer dielectric layer using the etched SOC layer and the second-etched MFHM layer as an etch barrier to form a contact hole, wherein the fluorine-based gas used in second etching the first-etched MFHM consists essentially of a gas mixture of $CHF_3$ at a flow of approximately 8 sccm to approximately 12 sccm and He at a flow rate of approximately 90 sccm to approximately 110 sccm.

5. The method of claim 4, wherein the MFHM layer contains silicon.

6. The method of claim 4, wherein the fluorine-based gas used in first etching the MFHM layer includes a gas mixture of $CF_4$ and $CHF_3$.

7. The method of claim 4, wherein the contact hole is a storage node contact hole.

* * * * *